(12) United States Patent
Lee

(10) Patent No.: US 8,287,948 B2
(45) Date of Patent: Oct. 16, 2012

(54) IMAGE SENSOR AND METHOD FOR MANUFACTURING THE SAME

(75) Inventor: Won-Ho Lee, Chungcheongbuk-do (KR)

(73) Assignee: Intellectual Ventures II LLC, Wilmington, DE (US)

( * ) Notice: Subject to any disclaimer, the term of this patent is extended or adjusted under 35 U.S.C. 154(b) by 0 days.

(21) Appl. No.: 13/029,279

(22) Filed: Feb. 17, 2011

(65) Prior Publication Data

US 2011/0198486 A1 Aug. 18, 2011

Related U.S. Application Data

(62) Division of application No. 11/645,185, filed on Dec. 26, 2006, now Pat. No. 7,892,628.

(30) Foreign Application Priority Data

Dec. 26, 2005 (KR) .............................. 2005-0129439

(51) Int. Cl.
   *B05D 5/06* (2006.01)
(52) U.S. Cl. ............ 427/167; 427/74; 427/75; 427/162; 427/164; 427/165; 427/166; 427/168; 427/169; 257/232; 430/138; 382/240; 372/46.01; 428/212
(58) Field of Classification Search .................. 427/167; 257/232
   See application file for complete search history.

(56) References Cited

U.S. PATENT DOCUMENTS

| 5,725,975 | A | 3/1998 | Nakamura et al. |
| 6,040,591 | A * | 3/2000 | Otsuka .......................... 257/232 |
| 6,171,883 | B1 | 1/2001 | Fan et al. |
| 6,221,687 | B1 | 4/2001 | Abramovich |
| 6,307,243 | B1 | 10/2001 | Rhodes |
| 6,407,415 | B2 | 6/2002 | Lee |
| 6,614,479 | B1 | 9/2003 | Fukusho et al. |
| 6,617,189 | B1 | 9/2003 | Chen et al. |
| 6,638,786 | B2 * | 10/2003 | Yamamoto ...................... 438/57 |
| 6,661,581 | B1 * | 12/2003 | Sankur .......................... 359/653 |
| 2004/0071969 | A1 | 4/2004 | Okamoto |
| 2005/0088746 | A1 | 4/2005 | Yoshikawa et al. |
| 2005/0090035 | A1 | 4/2005 | Kim |
| 2005/0184353 | A1 | 8/2005 | Mouli |

FOREIGN PATENT DOCUMENTS

| JP | 04223371 | 8/1992 |
| JP | 2003060176 | 2/2003 |
| JP | 2003209231 | 7/2003 |
| JP | 2007053324 | 3/2007 |
| KR | 2001-0061335 | 7/2001 |
| KR | 2002-0048706 | 6/2002 |
| KR | 2003-002902 | 1/2003 |
| KR | 2004-0003166 | 1/2004 |

* cited by examiner

*Primary Examiner* — Michael Cleveland
*Assistant Examiner* — James M Mellott
(74) *Attorney, Agent, or Firm* — McAndrews, Held & Malloy, Ltd.

(57) ABSTRACT

An image sensor includes a color filter, an over-coating layer formed on the color filter, and a medium layer formed on the over-coating layer, wherein the medium layer is configured with at least two medium layers of which refractive indices are different from each other.

16 Claims, 11 Drawing Sheets

IMAGE SENSOR AND METHOD FOR MANUFACTURING THE SAME

CROSS-REFERENCE TO RELATED APPLICATIONS

The present application is a divisional of U.S. Ser. No. 11/645,185, now U.S. Pat. No. 7,892,628, filed Dec. 26, 2006, which claims priority to KR Application 10-2005-0129439, filed Dec. 26, 2005. Each of the above-identified applications are incorporated herein by reference in their entirety.

FIELD OF THE INVENTION

The present invention relates to a semiconductor manufacturing technology; and, more particularly, to a complementary metal-oxide semiconductor (CMOS) image sensor and a method of manufacturing the same.

DESCRIPTION OF RELATED ART

In recent years, demand for digital cameras has shown a tendency to explosively increase with the development of visual communication technologies that use the Internet. In addition, with an increasing supply of mobile communication terminals in which a camera is mounted such as personal digital assistants (PDA), international mobile telecommunications-2000 (IMT-2000) terminals, code division multiple access (CDMA) terminals or the like, demand for a miniature camera module increases accordingly.

Camera modules such as an image sensor module using a charge coupled device (CCD) or a complementary metal-oxide semiconductor (CMOS) image sensor, which is a basic constitution component, are widely spread and utilized. In the image sensor, a color filter is aligned over a light-sensing element for embodying color images, wherein the light-sensing element receives light from an exterior so as to generate photocharges and accumulate them. Such a color filter array CFA is configured with three colors such as: red (R), green (G), and blue (B); or yellow, magenta, and cyan.

In general, the image sensor is configured with a light-sensing element for sensing light and a logic circuit component for processing the sensed light into an electrical signal, which is, in turn, digitized into data. There has been numerous attempts to improve a fill factor, which represents an area ratio of the light-sensing element with respect to the overall image sensor. However, these attempts are limited since the logic circuit component basically cannot be removed. Therefore, light condensing technology has been introduced for changing paths of incident lights that enter to areas other than the light-sensing element and condensing the incident lights into the light-sensing element so as to enhance photosensitivity. To realize the light condensing technology, a method for forming a microlens on the color filter of the image sensor is particularly used.

FIG. 1 is a cross-sectional view illustrating a conventional image sensor having a color filter and a microlens.

Referring to FIG. 1, the conventional image sensor includes a plurality of photodiodes PD, a plurality of color filters CF, an over-coating layer OCL, a plurality of microlenses ML, and a low temperature oxide (LTO) layer. Herein, the plurality of photodiodes PD formed in a substrate SUB receive lights. The plurality of color filters CF are formed on the photodiodes PD such that they one-to-one correspond to the respective color filters CF. The over-coating layer OCL is formed on the color filters CF for removing a step caused by a height difference between the color filters CF. The plurality of microlenses ML are formed on the respective color filters CF in the shape of a dome. The low temperature oxide is formed on the over-coating layer OCL such that it covers the microlens ML.

The microlens ML, as described above, is formed on the color filter CF for increasing the sensitivity of the image sensor by condensing light onto the photodiode PD. The microlens ML acts as an important component, which plays a role in determining the sensitivity of the image sensor. Typically, it is reported that the sensitivity increases correspondingly as the size increases.

However, in the conventional image sensor, there often occurs a sensitivity difference between a central portion A and an edge portion B of the unit pixel, as illustrated in FIGS. 2A and 2B. Actually, in 1.3-mega pixel array, there is a great difference in sensitivity between the central and edge portions A and B. That is, the sensitivity of the central portion A is 1,200 mV/lux-sec, whereas the sensitivity of the edge portion B is 750 mV/lux-sec in case of a green pixel. The reason is that incident angles of light incident onto the central and edge portions A and B of the pixel array are different from each other, but they are formed of the same layer. Accordingly, as illustrated in FIG. 2B, an actual image appears to be darker in the edge portion B than the central portion A.

SUMMARY OF THE INVENTION

It is, therefore, an object of the present invention to provide an image sensor capable of increasing sensitivity at an edge portion of a pixel array.

It is another object of the present invention to provide an image sensor capable of resolving a complexity of manufacturing process owing to a process of forming a microlens for condensing an incident light.

It is yet another object of the present invention to provide a method for manufacturing the image sensor.

In accordance with an aspect of the present invention, there is provided an image sensor including: a color filter; an over-coating layer formed on the color filter; and a medium layer formed on the over-coating layer, wherein the medium layer is configured with at least two medium layers of which refractive indices are different from each other.

In accordance with another aspect of the present invention, there is provided an image sensor including: color filters formed on a first region and a second region, respectively, wherein an incident angle of a light to the second region is greater than that of a light to the first region; an over-coating layer formed on the color filters; microlenses formed on the over-coating layer such that they are correspondent to the color filters, respectively; a medium layer covering the microlenses in the second region, wherein the medium layer has a refractive index higher than that of air; and a capping layer covering a resultant structure including the medium layer.

In accordance with still another aspect of the present invention, there is provided an image sensor including: color filters formed on a first region and a second region, respectively, wherein an incident angle of a light to the second region is greater than that of a light to the first region; an over-coating layer formed on the color filters; microlenses formed on the over-coating layer such that they are correspondent to the color filters, respectively; a first medium layer covering the microlenses in the second region, wherein the first medium layer has a refractive index higher than that of air; a second medium layer covering a resultant structure including the first medium layer, wherein the second medium layer has a refractive index lower than that of the first medium layer; and a capping layer formed on the second medium layer.

In accordance with further aspect of the present invention, there is provided an image sensor including: color filters; an over-coating layer formed on the color filters; microlenses formed on the over-coating layer such that they are correspondent to the color filters, respectively; and a medium layer formed on the over-coating layer, wherein the medium layer is configured with at least two medium layers of which refractive indices are different from each other.

In accordance with yet further aspect of the present invention, there is provided a method for manufacturing an image sensor, including: forming color filters on a first region and a second region, respectively, wherein an incident angle of a light to the second region is greater than that of a light to the first region; forming an over-coating layer on the color filters; forming microlenses on the over-coating layer such that they are correspondent to the color filters, respectively; forming a first medium layer covering the microlenses, wherein the first medium layer has a refractive index higher than that of air; removing the first medium layer formed in the first region so that the first medium layer remains only in the second region; forming a second medium layer such that it covers a resultant structure including the first medium layer, wherein the second medium layer has a refractive index lower than that of the first medium layer; and forming a capping layer on the second medium layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

An image sensor and a method for manufacturing the same in accordance with exemplary embodiments of the present invention will be described in detail with reference to the accompanying drawings.

The image sensor of the present invention increases sensitivity at edge portions of a pixel array using a principle of light refraction based on Snell's law. Thereinafter, Snell's law will be illustrated with reference to FIG. 3.

Figure 1:
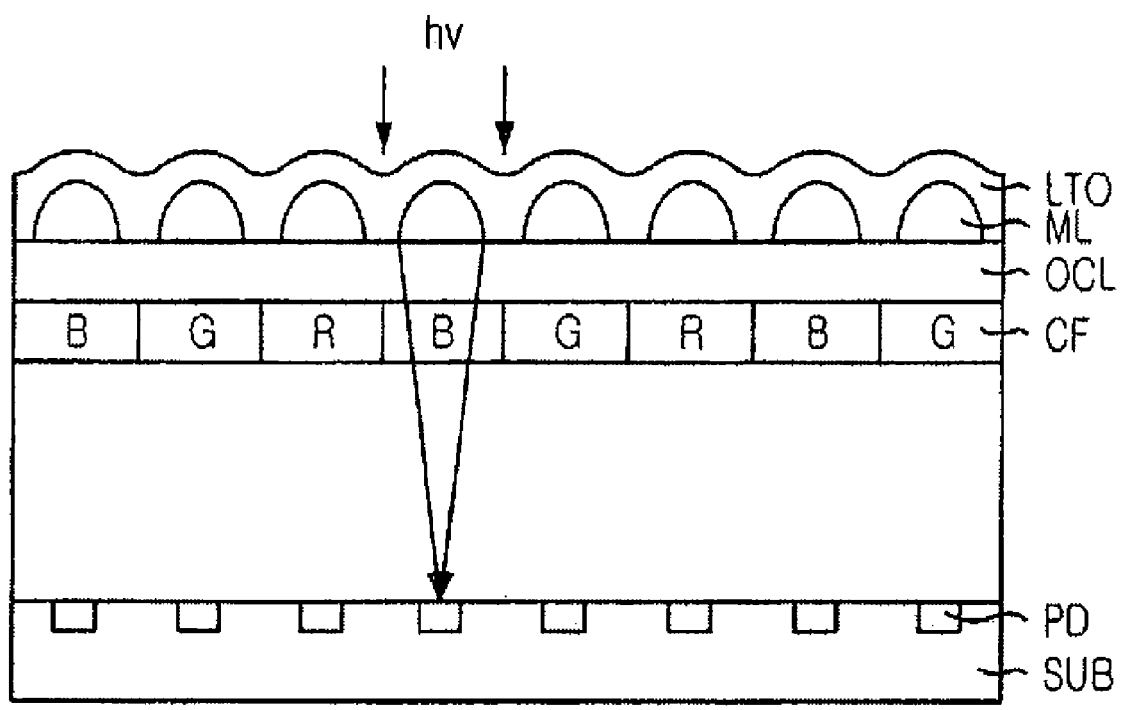
FIG. 1 is a cross sectional view of a conventional complementary metal-oxide semiconductor (CMOS) image sensor.
Figure 2A:
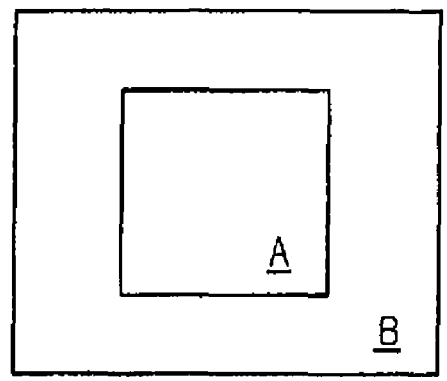
FIGS. 2A and 2B are schematic views setting forth a problem of the conventional CMOS image sensor.
Figure 2B:
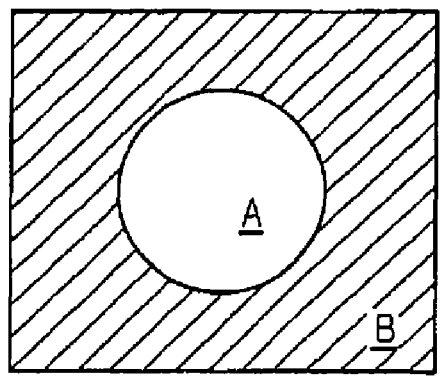
Figure 3:
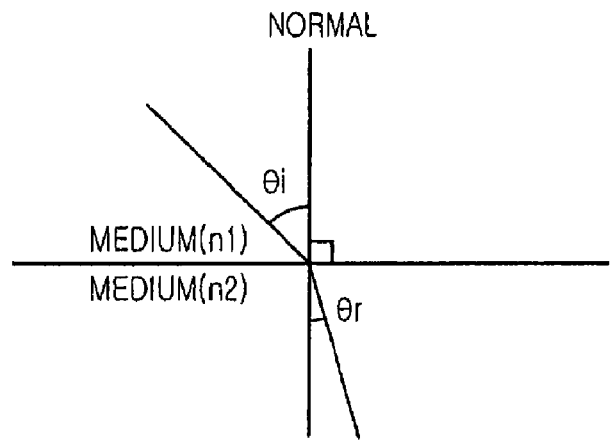
FIG. 3 is a schematic view explaining Snell's law.

Referring to FIG. 3, an incident ray, a refractive ray and a normal line perpendicular to a boundary between two media exist in the same plane according to Snell's law. In addition, a ratio of sine of an incident angle θi with respect to sine of a refractive angle θr is constant, which is equal to a ratio of light velocity in one medium with respect to light velocity in another medium, and a reciprocal of a ratio of refractive index of one medium with respect to refractive index of another medium. That is, Snell's law can be briefly summarized as below.

$$\frac{\sin\theta i}{\sin\theta r} = \frac{n2}{n1} = \frac{v1}{v2} = n12 \quad \text{[Eq. 1]}$$

where θi is greater than θr if n2>n1.

That is, if the light changes a pathway from the medium with low refractive index to the medium with high refractive index when the light propagates, the refractive angle is smaller than the incident angle.

On the basis of Snell's law, the inventive image sensor will be more fully illustrated with accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals in the drawings denote like elements.

Embodiment 1

Figure 4:
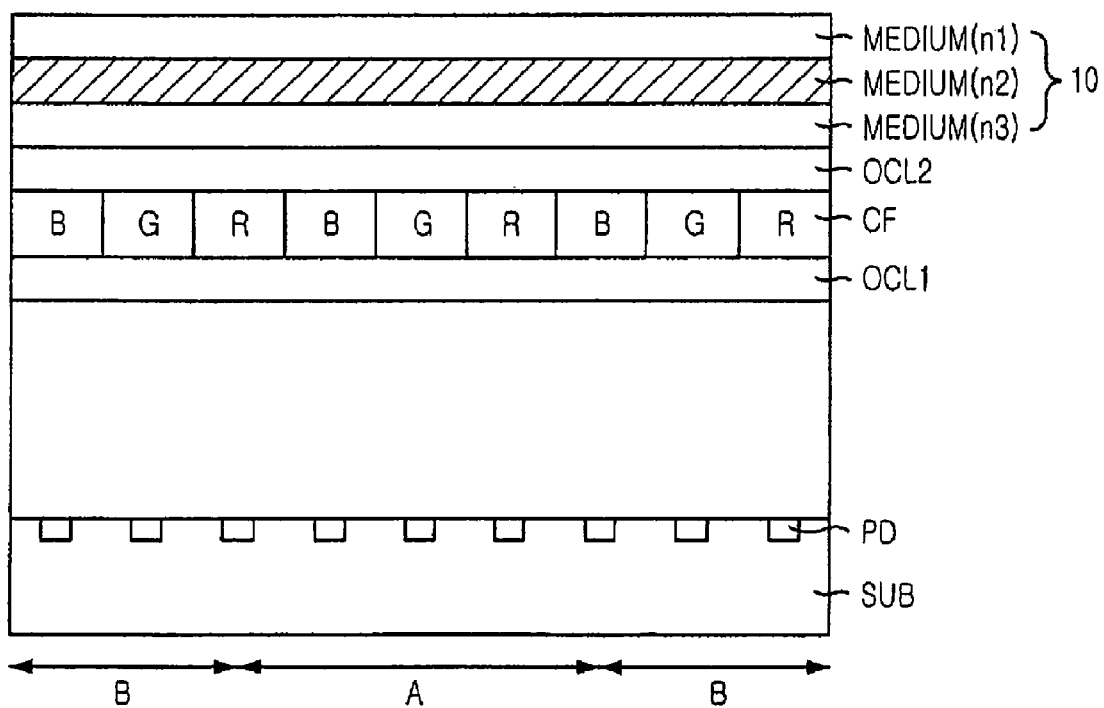
FIG. 4 is a cross sectional view illustrating an image sensor in accordance with a first embodiment of the present invention.

FIG. 4 is a cross sectional view illustrating an image sensor in accordance with a first embodiment of the present invention.

Referring to FIG. 4, in the image sensor in accordance with the first embodiment of the present invention, a medium layer 10 includes at least two medium layers having different refractive indices. Herein, for the sake of illustrative convenience, the medium layer 10 is configured with three medium layers, for example.

Specifically, the image sensor in accordance with the first embodiment of the present invention includes a plurality of photodiodes PD, a plurality of transistors (not shown), a plurality of interlayer insulating layers (not shown), a metal interconnection (not shown), a first over-coating layer OCL1, a color filter CF, a second over-coating layer OCL2, and a medium layer 10. Herein, the plurality of photodiodes PD are formed in a substrate SUB for receiving an incident light. The plurality of transistors, which are disposed on the substrate SUB, transfer charges accumulated at the photodiode PD. The plurality of interlayer insulating layers are formed such that they cover the plurality of transistors. The metal interconnection is interposed between the interlayer insulating layers. The first over-coating layer OCL1 is formed for removing a step due to the metal interconnection. The color filters CF are formed on top of the first over-coating layer OCL1 such that they one-to-one correspond to the respective photodiodes PD. The second over-coating layers OCL2, which is disposed on top of the color filters CF, is formed for removing a step due to the color filter CF. The medium layer 10 is formed on top of the second over-coating layer OCL2.

The medium layer 10 is configured with three medium layers of which refractive indices are different from one another, wherein the number of the medium layers may be equal to three or less, or three or more. The medium layer 10 may be formed such that a medium having a higher refractive index is formed in a direction that the second over-coating layer OCL2 is formed, i.e., in a direction of the photodiode PD. That is, it is preferred that the medium layers are sequentially disposed on the second over-coating layer OCL2 in a decreasing order of refractive index, i.e., n1<n2<n3. In addition, the uppermost medium layer n1 of the medium layer 10, i.e. the medium layer in contact with air, may have a refractive index higher than that of air. For example, since the refractive index of air is 1, it is preferable that the uppermost medium layer has the refractive index greater than 1.

The uppermost medium layer n1 of the medium layer 10 acts as a capping layer for a chip, and is formed of a medium having a refractive index greater than that of air (n=1.0029). For example, the medium may be a silicon oxide material having a refractive index in range of approximately 1.4 to approximately 1.45. A middle medium layer n2 may be omitted in consideration of a total thickness of a chip. In this case, the medium layer 10 may be configured with only two medium layers. Herein, the refractive index of the middle medium layer n2 should be higher than that of the uppermost medium layer n1, but lower than that of the lowermost medium layer n3. For example, the middle layer n2 is formed of a boron phosphorus silicate glass (BPSG) or an undoped silicate glass (USG), of which refractive index is 1.5. Preferably, the lowermost layer n3 is formed of a medium which has the highest refractive index and can minimize a reflection angle of a light.

Hereafter, advantageous effects of the image sensor in accordance with the present invention will be illustrated with reference to FIG. 5.

Figure 5:
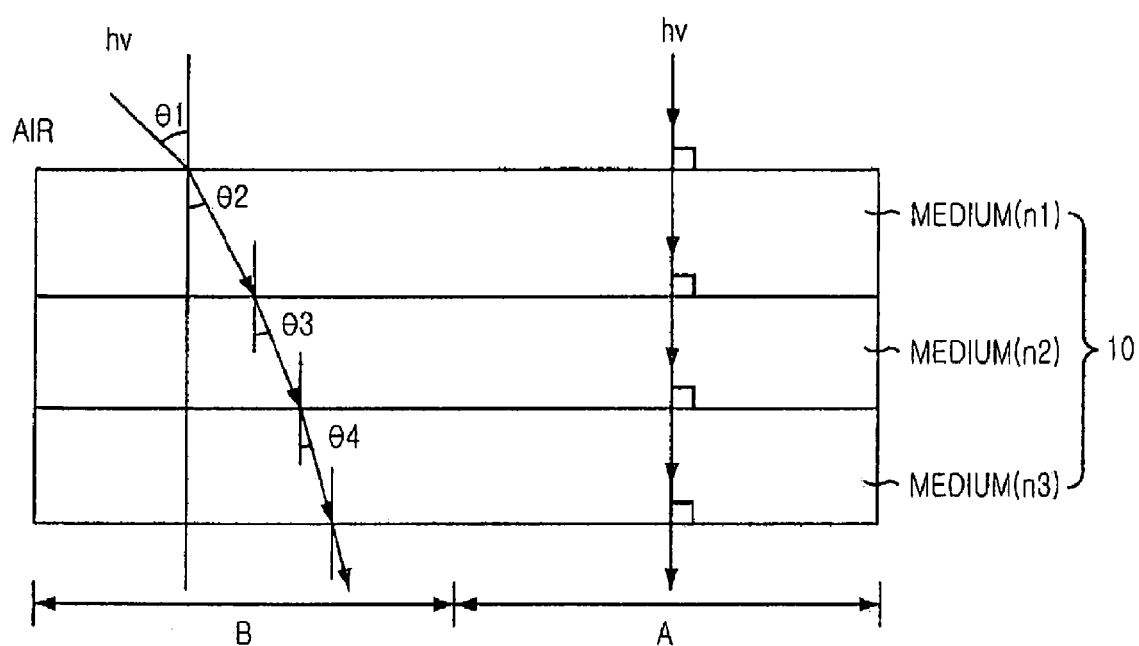
FIG. 5 is an enlarged sectional view explaining a principle of a light refraction of the image sensor of FIG. 4.

As shown in FIG. 5, a relation of incident angles with respect to the three medium layers are θ1>θ2>θ3>θ4 at a side area, i.e. at an edge portion B, but θ1=θ2=θ3=θ4=0° at a central portion A. Therefore, the sensitivity at the edge portion B of the pixel array can be improved in comparison with the prior art.

The image sensor in accordance with the first embodiment of the present invention as illustrated above does not employ a microlens but uses the medium layer in which several media are stacked. Accordingly, it possible to omit the process of forming the microlens, which is relatively difficult process for control, and thus simplify the manufacturing process.

Embodiment 2

Figure 6:
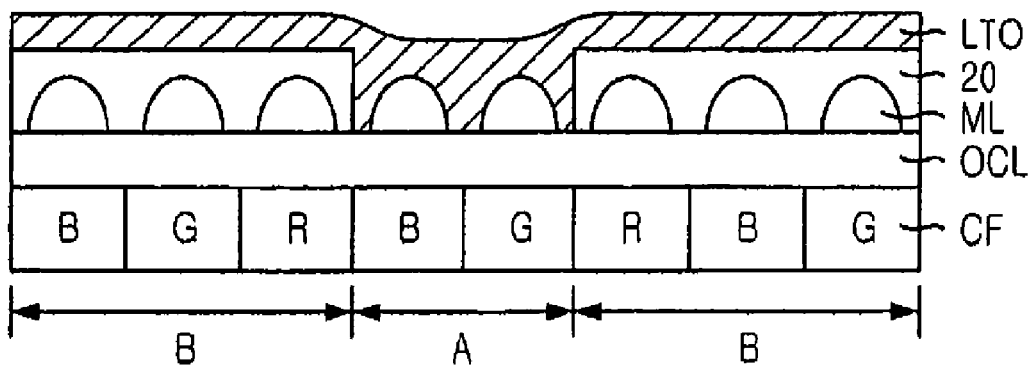
FIGS. 6 and 7 are cross sectional views illustrating an image sensor in accordance with a second embodiment of the present invention.
Figure 7:
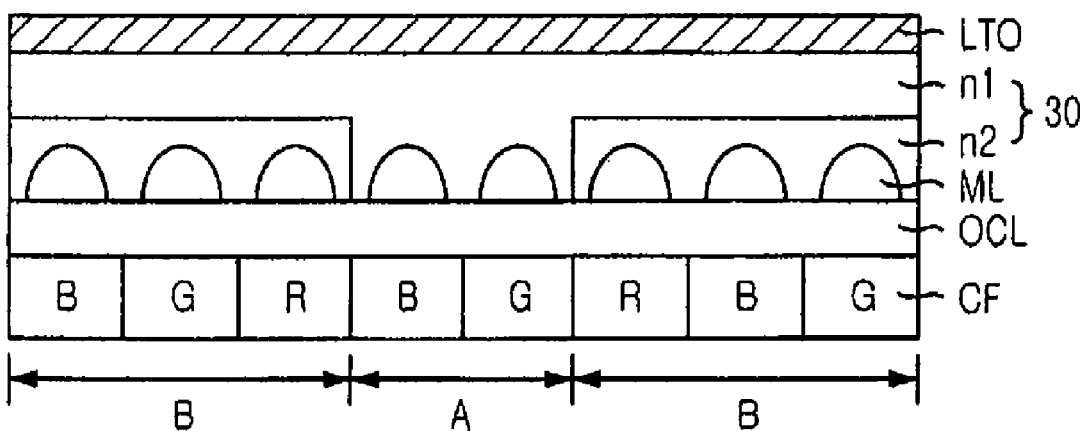

FIGS. 6 and 7 are cross sectional views illustrating an image sensor in accordance with a second embodiment of the present invention.

Referring to FIGS. 6 and 7, in an image sensor in accordance with the second embodiment of the present invention, a medium layer having at least one medium layer is formed on a microlens ML. Here, if the number of medium layer is two or more, respective medium layers have different refractive indices.

In detail, the image sensor in accordance with the second embodiment of the present invention includes a color filter CF, an over-coating layer OCL, microlenses ML, a medium layer 20, and a low temperature oxide layer LTO. Herein, the color filters CF are formed on top of the over-coating layer OCL such that they one-to-one correspond to respective photodiodes PD. The over-coating layer OCL, which is disposed on top of the color filter CF, is formed for removing a step due to the color filter CF. The microlenses ML are formed on top of the over-coating layer OCL such that they one-to-one correspond to the color filters CF, respectively. The medium layer 20 is formed such that it covers the microlenses at edge portions B of the pixel array. The low temperature oxide layer LTO is formed such that it covers the resultant structure including the medium layer 20. Herein, it is preferable that the medium layer 20 is formed of a medium having a refractive index equal to 1.4 or higher. For example, it is preferable that the medium layer 20 is formed of spin on glass (SOG), fluorinated silicate glass (FSG) or an oxide-based material used as a device isolation layer formed through shallow trench isolation (STI) process such as high density plasma (HDP) oxide and carbon doped oxide (CDO) or the like.

Meanwhile, referring to FIG. 7, there is formed a medium layer 30 in which two medium layers are stacked, instead of the single medium layer 20 of FIG. 6. That is, as shown in FIG. 7, the medium layer 30 at the edge portion B is configured with two medium layers n1 and n2 of which refractive indices are different from each other, whereas the medium layer 30 at the central portion A is a single medium layer configured with only the medium layer n1. Herein, it is preferable that an upper medium layer n1 has a refractive index lower than that of a lower medium layer n2. The upper medium layer n1 is formed of a material having a refractive index in a range of approximately 1.4 to approximately 1.5, and the lower medium layer n2 is formed of a material having the refractive index of approximately 1.5.

Figure 8:
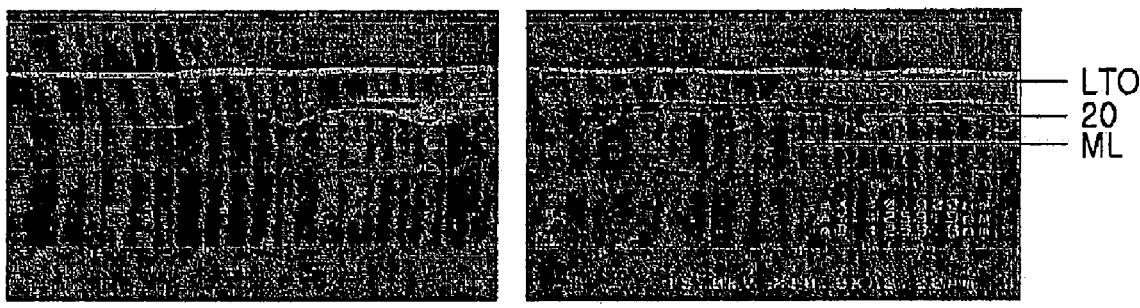
FIG. 8 is a SEM (scanning electron microscope) micrograph of the image sensor shown in FIG. 6.
Figure 9:
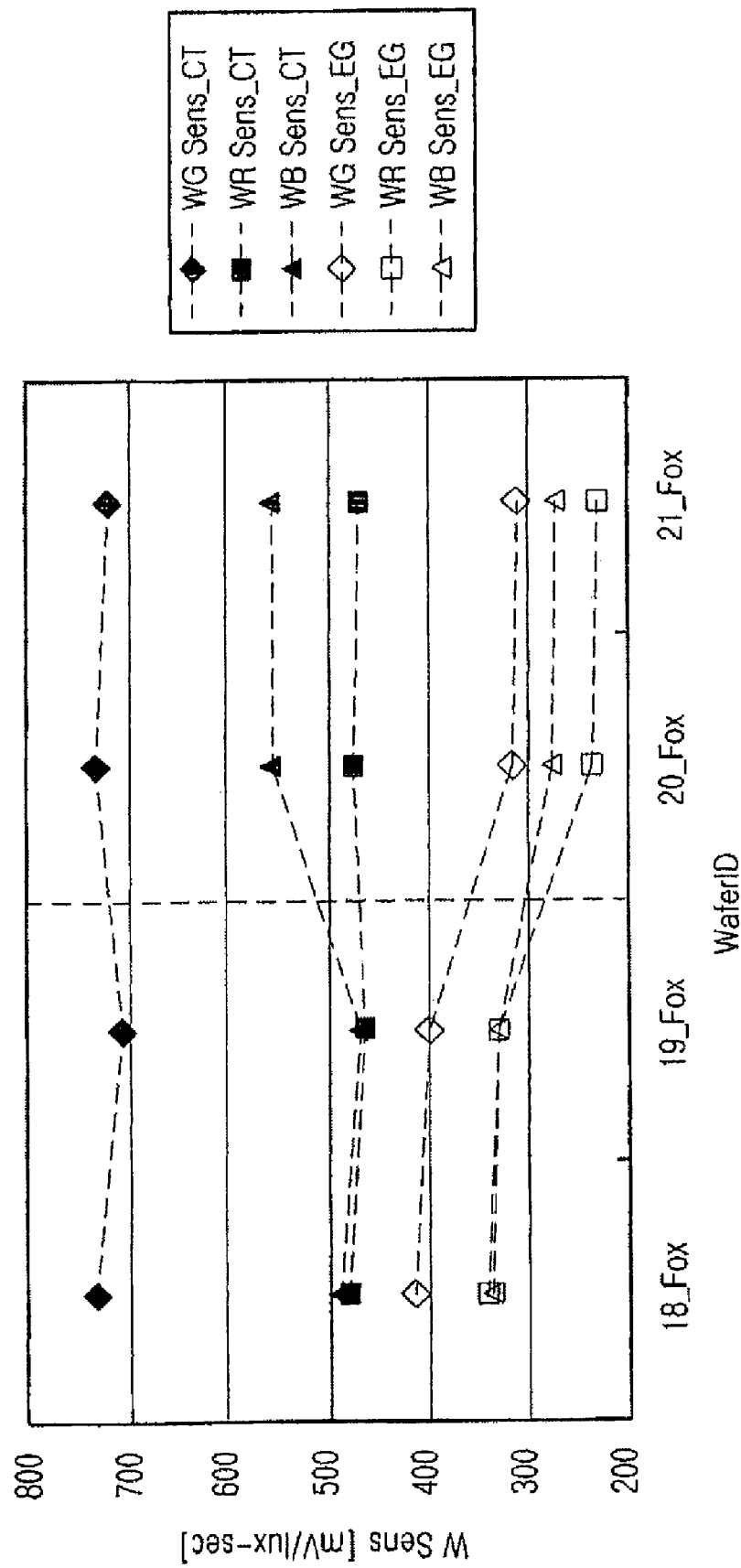
FIG. 9 is a diagram illustrating a characteristic of the image sensor having the structure of FIG. 8.

Meanwhile, FIG. 8 is a SEM micrograph of the image sensor in which the medium layer 20 is interposed between the microlens ML and the low temperature oxide layer LTO as shown in FIG. 6. FIG. 9 shows that sensitivity and color sensitivity are improved in virtue of the structure of FIG. 8.

Hereafter, a method for manufacturing the image sensor of FIG. 6 will be illustrated with reference to FIGS. 10A to 10C.

Figure 10A:
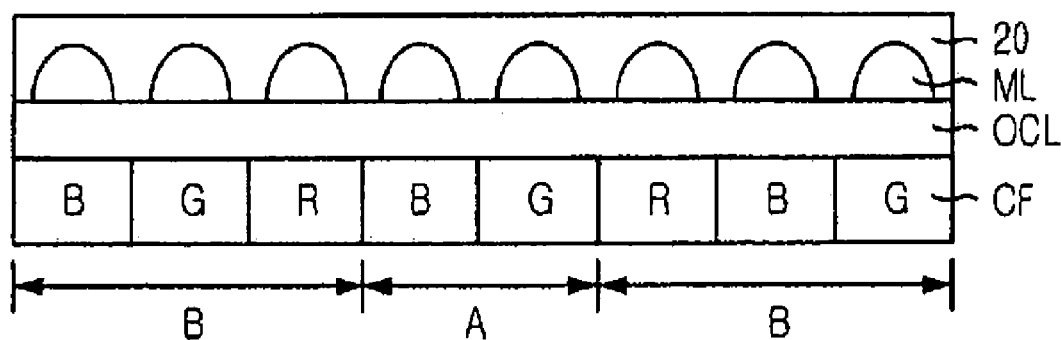
FIGS. 10A, 10B and 10C are cross sectional views illustrating a method for manufacturing the image sensor of FIG. 6.

First, as shown in FIG. 10A, an over-coating layer OCL is formed on top of a substrate in which color filters CF are formed. Thereafter, microlenses ML are formed on the over-coating layer OCL such that they one-to-one correspond to the respective color filters CF. Subsequently, a medium layer 20 is deposited or coated such that it covers the microlenses ML.

Figure 10B:
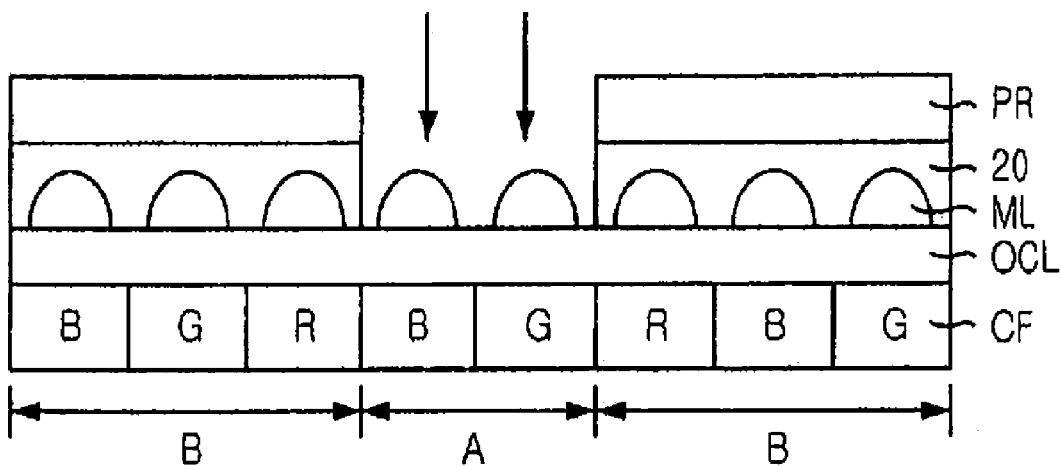

Next, as shown in FIG. 10B, a photolithograph process is performed to form a photoresist pattern PR exposing the central portion A of the pixel array, and a wet etching process is then performed to remove the exposed medium layer 20. Hereby, the medium layer 20 is removed at the central portion A but remains at edge portions B. Afterwards, a photoresist pattern is removed by a strip process.

Figure 10C:
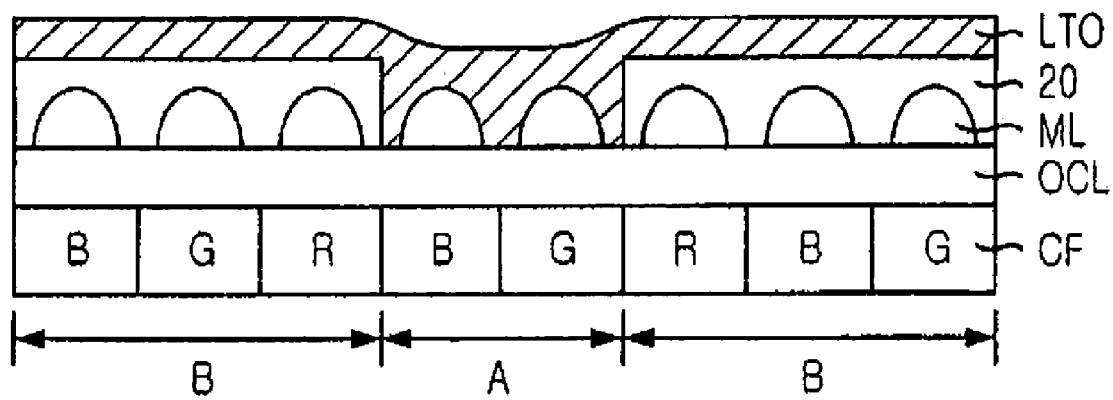

Thereafter, as shown in FIG. 10C, a low temperature oxide layer LTO is formed to cover over the resultant structure including the medium layer 20. Meanwhile, before forming the low temperature oxide layer LTO, another medium layer having a refractive index lower than that of the medium layer 20 may be formed on the resultant structure including the medium layer 20.

Embodiment 3

Figure 11:
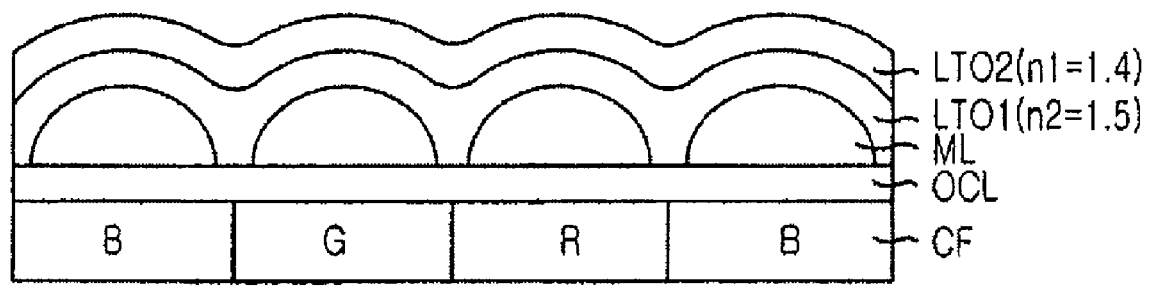
FIG. 11 is a cross sectional view illustrating an image sensor according to a third embodiment of the present invention.

FIG. 11 is a cross sectional view illustrating an image sensor in accordance with a third embodiment of the present invention.

In FIG. 11, a medium layer may be formed by stacking low temperature oxide layers LT01 and LT02 instead of the medium layer 30 of FIG. 7. Here, the low temperature oxides LT01 and LT02 are formed such that they have different refractive indices, wherein the lower low temperature oxide layer LT01 has a higher refractive index than the upper low temperature oxide layer LT02.

Figure 12A:
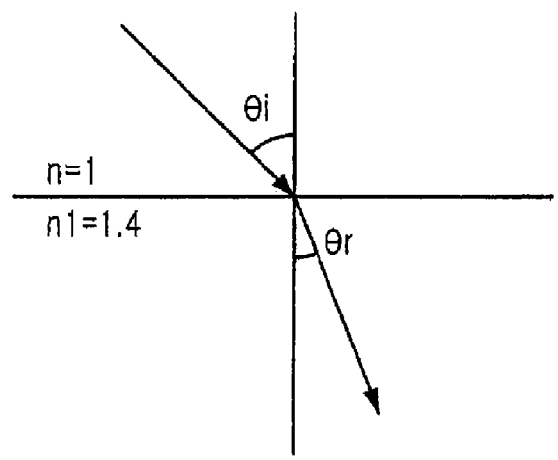
FIGS. 12A and 12B are schematic views explaining a principle of a light refraction in the image sensor shown of FIG. 11.
Figure 12B:
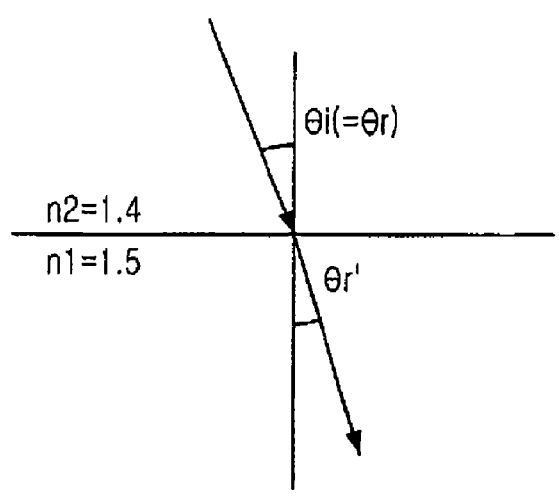

Thereinafter, a principle of light refraction according to refractive indices of the medium layers of FIG. 11 will be illustrated with reference to FIGS. 12A and 12B.

Generally, an incident angle of light entering the side portion B of the pixel array is greater than that of light entering a central portion A. By lowering the incident angle of the light entering the side portion B, sensitivity at the side portion B of the pixel array can be improved as shown in FIGS. 12A and 12B. That is, in FIGS. 12A and 12B, the relation of the incident angles with respect to the respective media satisfies a following inequality condition such as $\theta i > \theta r(\theta i') > \theta r'$ so that the incident angle with respect to the side portion B of the pixel array decreases.

The present application contains subject matter related to the Korean patent application No. KR 2005-0129439, filed in the Korean Patent Office on Dec. 26, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method, comprising:
   forming, color filters on a first region and a second region, respectively, wherein an incident angle of light to the second region is greater than an incident angle of light to the first region;
   forming an over-coating layer on the color filters;
   forming on the over-coating layer, a plurality of microlenses in both the first region and the second region;
   forming a first medium layer continuously covering the microlenses formed in the second region but not covering the microlenses formed in the first region; and
   forming a second medium layer covering both the first medium layer and the microlenses formed in the first region.

2. The method of claim 1, wherein said forming the first medium layer comprises forming the first medium layer from a material having a refractive index of at least approximately 1.4.

3. The method of claim 1, wherein said forming the first medium layer comprises forming the first medium layer from silicon oxide, boron phosphorus silicate glass, or undoped silicate glass.

4. The method of claim 1, wherein said forming the first medium layer comprises:
   forming the first medium layer over the microlenses formed in both the first region and the second region; and
   removing the first medium layer from the first region.

5. The method of claim 1, wherein said forming the first medium layer comprises forming the first medium layer from a material that has a refractive index higher than that of air.

6. The method of claim 1, wherein said forming the second medium layer comprises forming the second medium layer from a material that has a refractive index lower than that of the first medium layer.

7. The method of claim 1, further comprising forming a capping layer over the second medium layer.

8. A method, comprising:
   forming a first plurality of photodiodes in a central portion of a substrate and a second plurality of photodiodes in an edge portion of the substrate;
   forming a first medium layer over the second plurality of photodiodes but not continuously covering the first plurality of photodiodes; and
   forming a capping layer over both the first plurality of photodiodes and the medium layer.

9. The method of claim 8, wherein said forming a capping layer comprises forming the capping layer from a material having a higher refractive index than air.

10. The method of claim 9, wherein said forming the first medium layer comprises forming the first medium layer from a material having a higher refractive index than the capping layer.

11. The method of claim 8, further comprising forming a second medium layer over the first medium layer before said forming a capping layer.

12. The method of claim 11, wherein said forming the second medium layer comprises forming the second medium layer from a material having a higher refractive index than the capping layer but a lower refractive index than the first medium layer.

13. The method of claim 8, wherein said forming the first medium layer comprises:
   forming the first medium layer over both the first plurality of photodiodes and the second plurality of photodiodes; and
   removing the first medium layer from the first plurality of photodiodes.

14. The method of claim 8, further comprising:
   forming color filters associated with both the first plurality of photodiodes and the second plurality of photodiodes; and
   forming an over-coating layer on the color filters.

15. The method of claim 8, further comprising forming a first plurality of microlenses associated with the first plurality of photodiodes and a second plurality of microlenses associated with the second plurality of photodiodes.

16. The method of claim 15, wherein said forming a first medium layer comprises forming the first medium layer such that the first medium layer covers the second plurality of microlenses but does not cover the first plurality of microlenses.

* * * * *

UNITED STATES PATENT AND TRADEMARK OFFICE
CERTIFICATE OF CORRECTION

PATENT NO. : 8,287,948 B2
APPLICATION NO. : 13/029279
DATED : October 16, 2012
INVENTOR(S) : Lee Page 1 of 1

It is certified that error appears in the above-identified patent and that said Letters Patent is hereby corrected as shown below:

In Column 4, Lines 15-16, in Equation 1, delete " $\frac{Sin\theta i}{Sin\theta r} = \frac{n2}{n1} = \frac{v1}{v2}$ " and insert -- $\frac{Sin\theta i}{Sin\theta r} = \frac{n2}{n1} = \frac{v1}{v2}$ --, therefor.

In Column 6, Line 62, delete "LT01 and LT02" and insert -- LTO1 and LTO2 --, therefor.

In Column 6, Line 64, delete "LT02" and insert -- LTO2 --, therefor.

In Column 6, Line 67, delete "LT02." and insert -- LTO2. --, therefor.

Signed and Sealed this
Second Day of April, 2013

Teresa Stanek Rea
*Acting Director of the United States Patent and Trademark Office*